United States Patent [19]
Westfall

[11] Patent Number: 6,123,551
[45] Date of Patent: Sep. 26, 2000

[54] ELECTRONIC CIRCUIT INTERCONNECTION METHOD AND APPARATUS

[75] Inventor: Alan Patrick Westfall, Calgary, Canada

[73] Assignee: Northern Telecom Limited, Montreal, Canada

[21] Appl. No.: 09/166,536

[22] Filed: Oct. 6, 1998

[51] Int. Cl.[7] .................................................. H01R 12/00
[52] U.S. Cl. .......................... 439/67; 439/493; 439/74; 349/150
[58] Field of Search .................. 439/67, 493, 74, 439/91; 349/150, 151, 152

[56] References Cited

U.S. PATENT DOCUMENTS

| | | | |
|---|---|---|---|
| 5,306,162 | 4/1994 | Armendariz | 439/493 |
| 5,436,744 | 7/1995 | Arledge et al. | 349/150 |
| 5,529,502 | 6/1996 | Peltier et al. | 439/493 |
| 5,668,700 | 9/1997 | Tagusa et al. | 349/150 |
| 5,730,619 | 3/1998 | Hamlin | 439/67 |
| 5,737,053 | 4/1998 | Yomogihara et al. | 349/150 |
| 5,737,272 | 4/1998 | Uchiyama et al. | 349/150 |
| 5,920,465 | 7/1999 | Tanaka | 439/67 |
| 5,938,455 | 8/1999 | Glovatsky et al. | 439/74 |

*Primary Examiner*—Paula Bradley
*Assistant Examiner*—Tho D. Ta
*Attorney, Agent, or Firm*—Cobrin & Gittes

[57] ABSTRACT

An electronic circuit interconnection method and apparatus involves mating a first circuit substrate with a second circuit substrate such that a projection of a circuit component mounted on at least one of the first and second circuit substrates is received in an opening in the other. The opening has a shape complementary to the projection, to register the first and second circuit substrates in a fixed orientation relative to each other in which contacts on the first circuit substrate are aligned and adjacent corresponding contacts on the second circuit substrate. The first and second circuit substrates are then clamped together to press the contacts on each substrate toward each other to place and maintain them in contact with each other.

19 Claims, 5 Drawing Sheets

ELECTRONIC CIRCUIT INTERCONNECTION METHOD AND APPARATUS

FIELD OF THE INVENTION

This invention relates to interconnection of electronic circuits on different substrates.

BACKGROUND OF THE INVENTION

Liquid Crystal Display (LCD) assemblies often include a glass substrate on which is mounted an LCD element and an LCD controller chip. Such assemblies must be connected to controlling circuitry which may include a microprocessor located on an adjacent or nearby circuit board, creating a need to interconnect the LCD assembly with a circuit board on which the microprocessor is mounted.

At present, such interconnection is provided by a flexible copper circuit on polyimide film, which is adhesively secured to the LCD glass substrate. In order to make this connection it is necessary to accurately align contacts on the flexible copper circuit with corresponding contacts on the glass substrate, which requires care and precision, due to the typically close spacing of contacts.

Traditional methods of aligning mating substrates, used with conventional circuit boards have included drilling holes in the circuit board and inserting connector components through the holes. These methods are not available for glass substrates as holes cannot easily be drilled in glass without substantial cost.

Attempts to align the contacts have included aligning an edge of the flexible copper circuit with an edge of the glass substrate however, this method is unreliable as the relative positions of the edge of the glass substrate and contacts on the substrate are not accurately controlled.

What would be desirable therefore is an improved way of accurately aligning a flexible copper circuit with a glass substrate so that contacts on each can be quickly and accurately aligned and connected.

SUMMARY OF THE INVENTION

The present invention addresses the above need by taking advantage of the accurate placement of a projecting portion of a circuit component on a first substrate, relative to interconnection contacts thereon and the use of an accurately cut opening in a second substrate for receiving the projecting portion, such that the projecting portion and the opening cooperate to align the second substrate with the first substrate to align corresponding contacts on each substrate.

In accordance with one aspect of the invention, there is provided an electronic circuit interconnection method and apparatus which involves mating a first circuit substrate with a second circuit substrate such that a projection of a circuit component mounted on at least one of the first and second circuit substrates is received in an opening in the other. The opening has a shape complementary to the projection, to register the first and second circuit substrates in a fixed orientation relative to each other in which contacts on the first circuit substrate are aligned and adjacent corresponding contacts on the second circuit substrate. The first and second circuit substrates are then clamped together to press the contacts on each substrate toward each other to place and maintain them in contact with each other.

In accordance with another aspect of the invention, there is provided an apparatus for connecting a first circuit on a first substrate to a remotely located circuit, where the first circuit substrate has a circuit component of a first shape projecting therefrom. The apparatus includes a second circuit substrate having edges defining an opening for receiving the component. The opening has a shape complementary to the shape of the component. The cooperation between the projection and the opening registers the first and second substrates in a fixed orientation relative to each other such that contacts on the first circuit substrate are aligned with and adjacent corresponding contacts on the second circuit substrate. The apparatus also includes a clamp for clamping the first and second circuit substrates together to press the contacts against corresponding contacts.

More particularly, the first substrate may be a glass substrate and the second substrate may be a flexible circuit. Thus, there is provided a method of connecting a flexible circuit substrate to a glass circuit substrate. The method involves mating the glass circuit substrate with the flexible circuit substrate such that a chip on the glass circuit substrate is received in an opening in the flexible circuit substrate. The opening has a shape complementary to the chip such that when the chip is received in the opening the flexible circuit substrate is registered on the glass circuit substrate in a fixed orientation relative thereto in which contacts on the glass circuit substrate are aligned, adjacent and in contact with corresponding contacts on the flexible circuit substrate. The glass and flexible circuit substrates are clamped together to press contacts on the flexible circuit substrate against corresponding contacts on the glass circuit substrate.

In LCD assembly applications, the invention takes advantage of the necessary precise alignment of the LCD Controller IC with conductive mounting pads on the glass substrate which position the IC in a location on the substrate with great accuracy. The relative positions of IC mounting pads and contacts for connecting the assembly to other circuitry are fixed as such positions are determined by masks used to print the mounting pads, contacts and traces therebetween on the substrate. As the position of the IC is dictated by the position of the mounting pads, the IC is accurately positioned relative to contacts for connecting the assembly to other circuitry. Thus, the IC may be used as precise registration means for registering flex tail contacts with contacts on the substrate.

In general, the invention provides a low cost fine pitch interconnect between circuit substrates and has a specific use in connecting chip on glass LCDs to a main circuit assembly.

BRIEF DESCRIPTION OF THE DRAWINGS

In drawings which illustrate embodiments of the invention.

DETAILED DESCRIPTION

Figure 1:
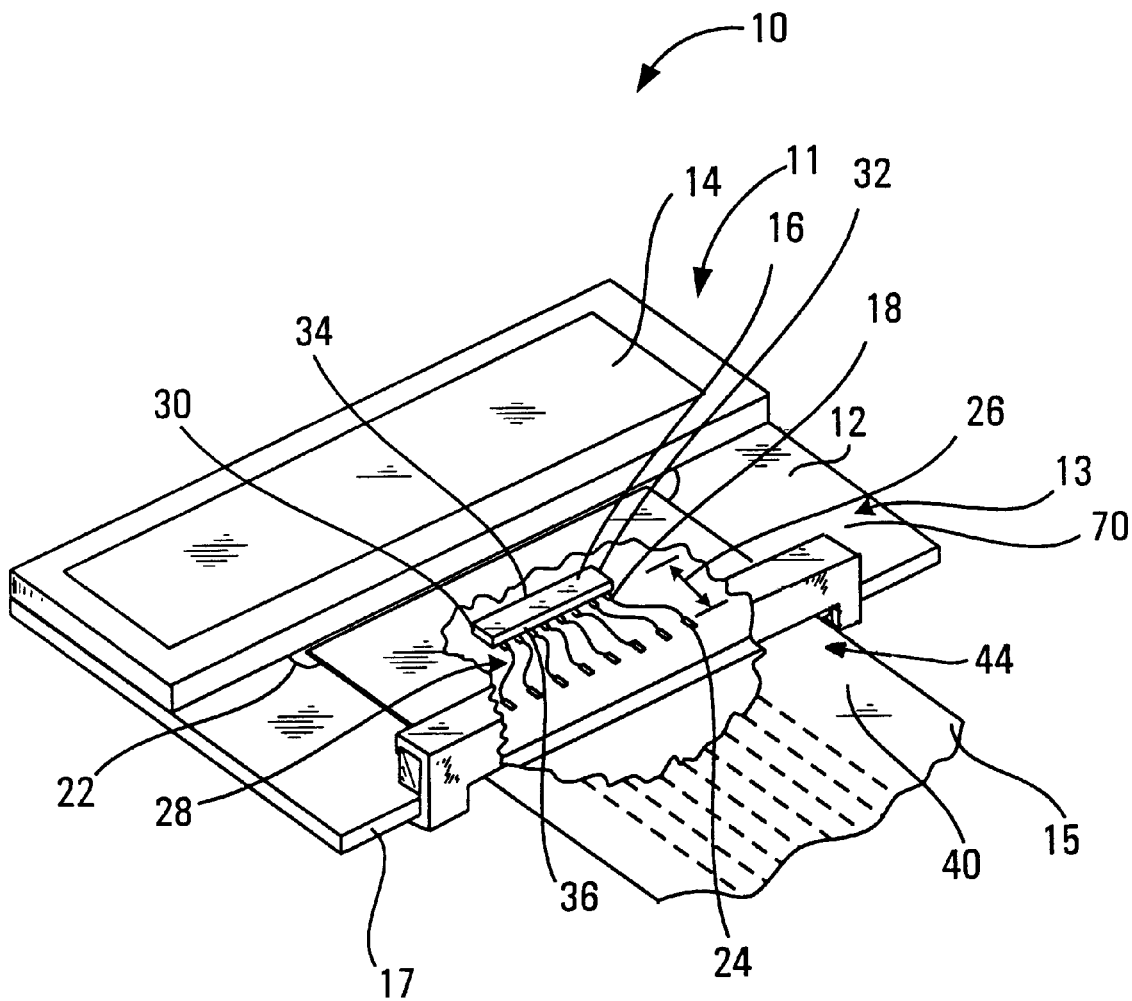
FIG. 1 is a fragmented perspective view of an apparatus for connecting a first circuit substrate to a second circuit substrate, according to a first embodiment of the invention.

Referring to FIG. 1, an apparatus for connecting a first circuit on a first substrate to a remotely located circuit on the second substrate, according to a first embodiment of the invention is shown generally at 10. In this embodiment, the apparatus includes an LCD assembly 11, a flex tail 15 and a clamp 13. The LCD assembly includes a first rigid, planar glass substrate 12 on which is mounted an LCD glass 14 and an LCD controller integrated circuit (IC) component or chip 16. The first substrate is thus a rigid circuit substrate.

The glass substrate 12 has imprinted thereon, four rows of contact pads, arranged to form a rectangle. The rows include a proximal row 18 disposed in a straight line parallel to an edge 17 of the planar glass substrate 12 to which respective corresponding rows of "bumps" on an underside (not shown) of the integrated circuit 16 are connected. A first plurality of circuit traces 22 extends between the LCD glass 14 and various contacts of the four rows of contact pads to connect the integrated circuit 16 to the LCD glass 14.

The glass substrate 12 further has a plurality of interface contacts 24 imprinted thereon, in a straight line parallel to and at a predefined distance 26 from the proximal row 18 of contact pads. The spatial relationship between the proximal row 18 of contact pads and the row of interface contacts is precise in that the distance 26 is accurate to at least ±0.05 mm.

A second plurality of circuit traces shown generally at 28 extends between contact pads of the four rows of contact pads, and respective interface contacts 24 to connect the interface contacts 24 to respective contact pads and corresponding bumps of the integrated circuit 16.

The integrated circuit 16 is in the form of a silicon die only and has no packaging. The die has first and second end surfaces 30 and 32 of a first length and first and second side surfaces 34 and 36 of a second length. These lengths are accurate to ±0.05 mm in accordance with conventional practices for manufacturing integrated circuits. The integrated circuit 16 is mounted on the four rows of contact pads such that the second side surface 36 extends parallel to, and immediately adjacent to, the proximal row 18 of contact pads. The distance between the side surface 36 and the straight line on which the interface contacts 24 are located, is therefore the same as the predefined distance 26 and is precise to ±0.1 mm. Thus, the size of the IC package and placement of the package on the first substrate 12 relative to the interface contacts 24 is very accurate.

When the integrated circuit is mounted as shown, each of the end surfaces 30 and 32 and side surfaces 34 and 36 is disposed perpendicularly to the plane of the glass substrate 12. Thus, the integrated circuit 16 projects perpendicularly from glass substrate 12.

FIG. 2

Figure 2:
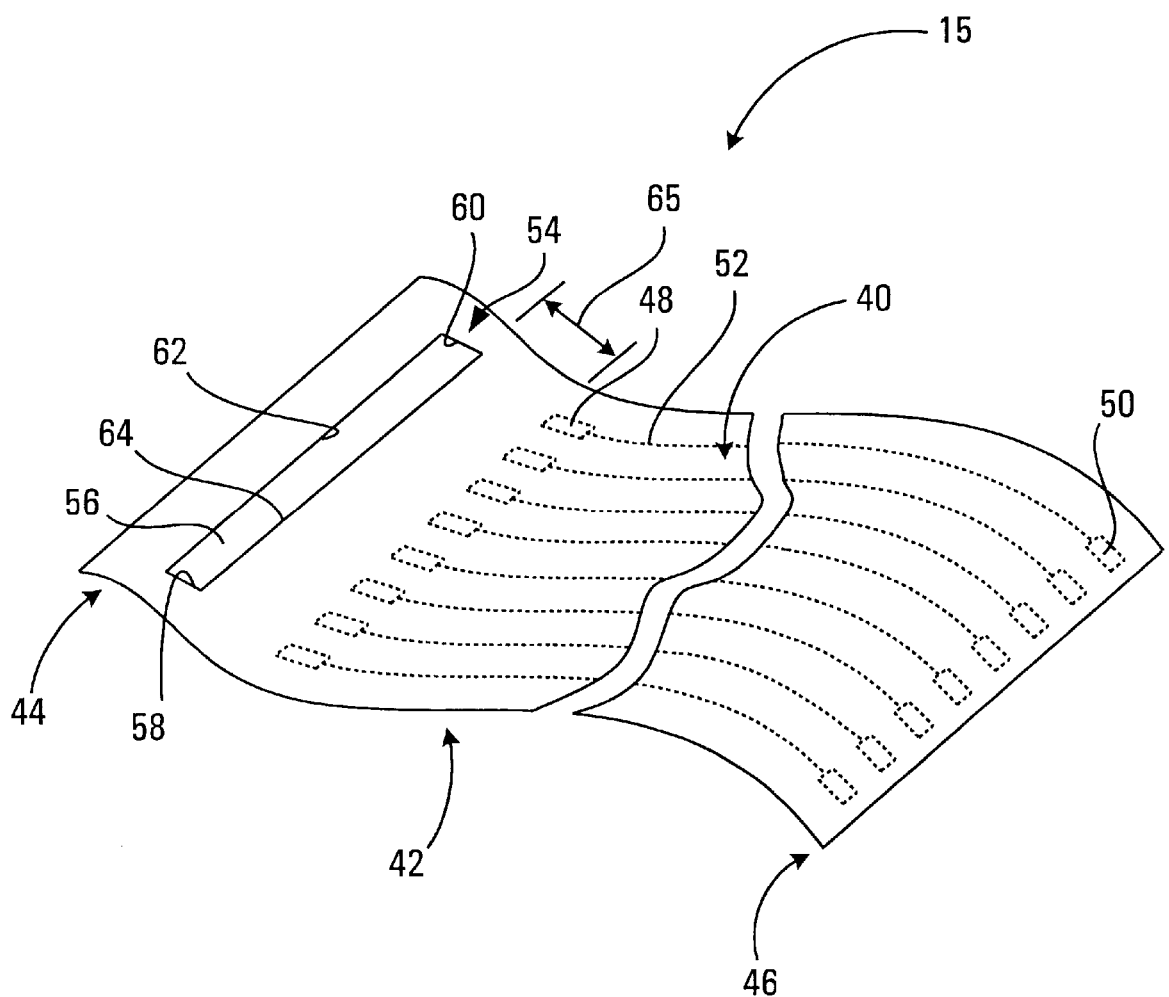
FIG. 2 is a perspective view of a flex tail shown in FIG. 1.

Referring to FIG. 2, the flex tail 15 is formed of an elongated rectangular length of polyester flex material having a first side 40 and a second, opposite side 42 and first and second end portions shown generally at 44 and 46 respectively.

A first row of contacts 48 is imprinted on the second side 42 of the first end portion 44 and a second row of contacts 50 is imprinted on the second side 42 of the second end portion 46. A plurality of carbon over silver ink, nickel or gold over copper etched conductors 52 is imprinted on the second side 42 to extend between respective contacts on the first and second end portions 44 and 46. The flex tail thus includes a second, flexible substrate, with contacts on the first end portion connected to corresponding contacts on the second end portion.

The first end portion 44 has a blank portion 54 which extends beyond the first row of contacts 48, away from the conductors 52. The blank portion 54 includes an elongated rectangular opening 56 having first and second end edges 58 and 60 and first and second side edges 62 and 64. The edges 58, 60, 62 and 64 are dimensioned to have the same length as corresponding surfaces 30, 32, 34 and 36 respectively of the integrated circuit 16 shown in FIG. 1. Thus, the edges define an opening which has a shape complementary to the shape of the projection, and the edges 58, 60, 62 and 64 are positioned to form the opening 56 such that edge 64 is disposed at a distance 65 from the contacts 48. This distance 65 is the same as the predefined distance 26 between the proximal row 18 and the interface contacts 24, shown in FIG. 1. Thus, the contacts 48 are in direct alignment with corresponding contacts 24 on the glass substrate 12 when the first end portion is laid on the glass substrate such that the IC is received in the opening 56.

Figure 3:
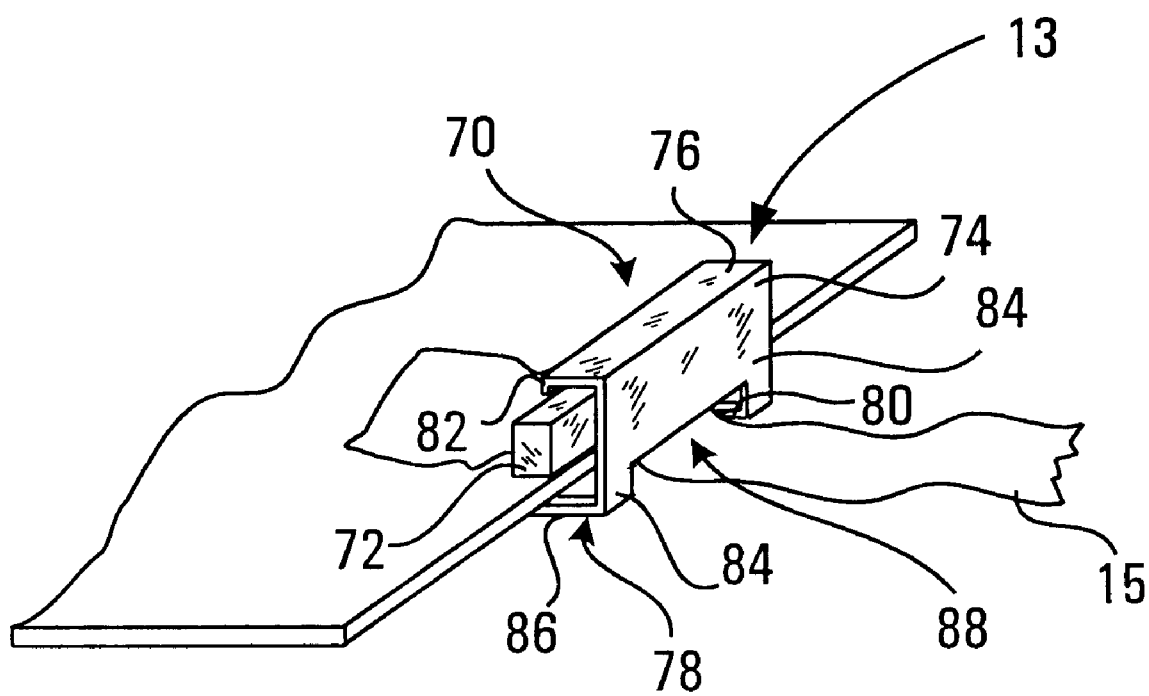
FIG. 3 is a perspective view of a clamp shown in FIG. 1.

Referring to FIG. 3, the clamp is shown generally at 13 and includes a spring steel clamping member 70 and a resilient member 72, which in this embodiment is rubber. The clamping member 70 includes a first flat web member 74 to which is formed a flat planar top portion 76 disposed at right angles thereto and first and second feet 78 and 80. The top portion 76 has a depending lip 82 which extends at right angles to the top portion 76, parallel to the web member 74.

The first and second feet 78 and 80 are similar and include a leg 84 which is terminated in a flat planar tab 86 extending at right angles to the web portion 74. The legs 84 on each of the feet 78 and 80 form a cut-out 88 for receiving the flex tail 15 therein between the first and second feet 78 and 80.

The resilient member 72 is formed from a length of rubber material having a rectangular parallelepiped shape. The resilient member 72 is dimensioned to be snugly received between the top portion 76 and the glass substrate 12 and between the lip 82 and web member 74 when the clamp is in position ready for clamping.

Operation

Figure 4:
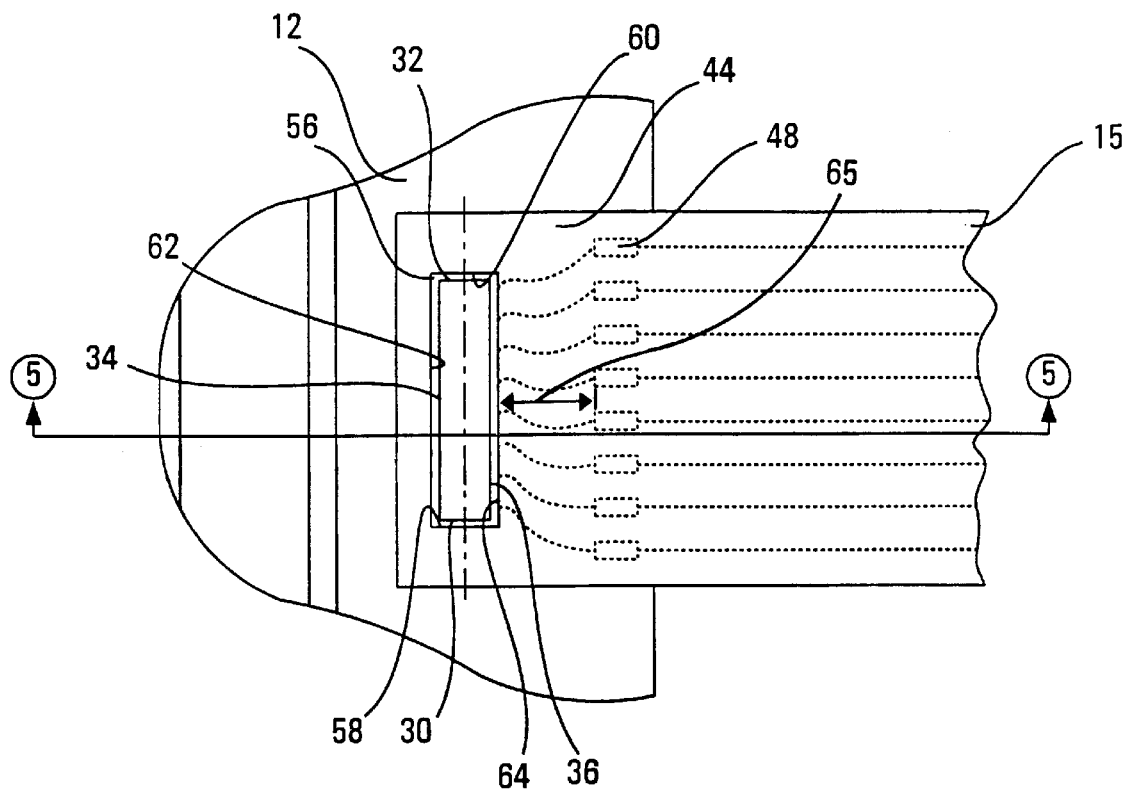
FIG. 4 is a plan view of the apparatus of FIG. 1.

Referring to FIG. 4, to use the apparatus, the first end portion 44 is laid on the substrate 12 with the contacts 48 facing toward the glass substrate 12, such that the IC 16 is received in the opening 56. The first and second end edges 58 and 60 and the first and second side edges 62 and 64 contact the end surfaces 30 and 32 and the side surfaces 34 and 36 respectively. The respective surfaces 30, 32 and 34 and 36 bear upon the respective edges 58, 60, 62 and 64 and interfere with movement of the first end portion 44 to maintain the first end portion in a precise location and orientation relative to the glass substrate 12.

As the distance 65 between the second edge 64 and the row of contacts 48 is the same as the predefined distance 26 between the second side 36 of the integrated circuit 16 and the row of interface contacts 24, respective contacts of the respective pluralities of contacts 48 and 24 (not shown in FIG. 4) are aligned and facing each other ready for contact. Thus, the IC and the opening cooperate to register the first and second substrates in a fixed orientation relative to each other in which contacts on the first circuit substrate are aligned and adjacent corresponding contacts on the second circuit substrate.

Figure 5:
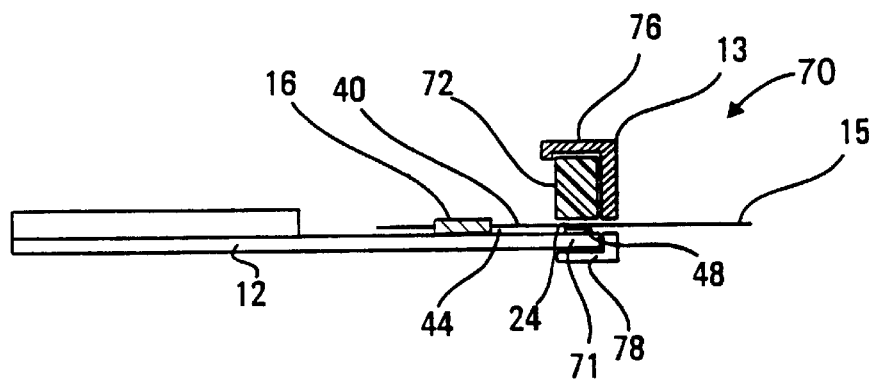
FIG. 5 is a partial side elevation section view of the apparatus of FIG. 1 along line S—S of FIG. 4.

Referring to FIG. 5, the clamping member 70 is then placed on the flex tail 15 to receive a portion 71 of the glass substrate 12 between the top member 76 and the first and second feet 78 and 80 (not shown). The resilient member 72 is then inserted between the top member 76 and the first side 40 of the first end portion 44.

The clamping member 70 is then pressed downwardly to compress the resilient member 72 and position the first and second feet 78 (and 80) under the glass substrate. The clamping member 70 is then released causing the feet to grip the glass substrate. The resilient member 72 is positioned directly over the contacts 48 and acts to press individual contacts of the row of contacts 48 against corresponding interface contacts 24 on the glass substrate 12, adjacent the opening 56.

Thus, the integrated circuit on the glass substrate 12 and the opening 56 cooperate to hold the first end portion 44 in a position relative to the glass substrate 12 such that the interface contacts 24 and 48 are aligned and the clamp 13 acts to securely hold the interface contacts 24 and 48 in contact with each other.

Referring to FIG. 2, the second end portion 46 may then be connected by contacts 50 to a control circuit board, (not shown), to permit signals from a control circuit to be communicated to the LCD integrated circuit via the flex tail 15.

Figure 6:
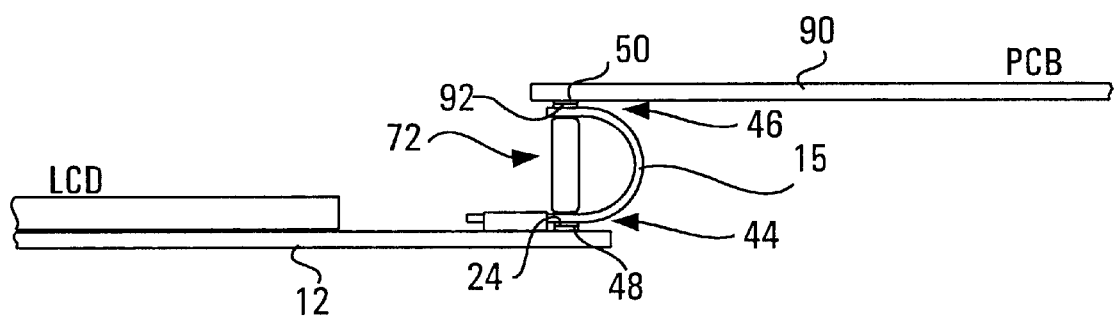
FIG. 6 is a fragmented cross-sectional view of an apparatus incorporating a termination of a second end portion of the flex tail shown in FIG. 1.

For example, referring to FIG. 6, the second end portion 46 of the flex tail 15 may be bent back, on top of the resilient rubber member 72 so that the contacts 50 on the second end portion face upwardly. A second rigid substrate such as a conventional printed circuit board 90 having a row of contacts 92 is placed in position adjacent the second end portion 46 to mate contacts 50 with corresponding contacts 92. A clamp (not shown) or housing portions in which the printed circuit board and glass substrate are to be housed (not shown) is then used to apply pressure to the printed circuit board 90 and the glass substrate 12 to sandwich the resilient member 72 and the first and second end portions 44 and 46 of the flex tail 15 therebetween. This creates a pressure focused at the rows of contacts 24, 48 and 50, 92 in connection with each other which urges and maintains the contacts in contact at each end of the flex tail 15.

Alternatives

It will be appreciated that once the flex tail is aligned with the glass substrate the flex tail 15 may be secured to the glass substrate 12 using a number of different methods, including the use of alternative clamping apparatus, or use of an adhesive disposed between the flex tail 15 and the glass substrate 12.

It will further be appreciated that the opening 56 may be positioned and shaped to engage a projection of a circuit component other than an IC, so long as edges of the opening engage corresponding surfaces of the projection, such that the contacts on the flex tail are easily and accurately aligned and placed in contact with respective contacts on the substrate.

It will further be appreciated that the flex tail may be replaced with a rigid material formed to have a suitable opening and accurately positioned contacts for engaging mating contacts on the glass substrate 12.

It will also be appreciated that the projection may be located on the flex tail, and the opening may be formed on the LCD assembly, so long as the opening and projection have complementary shapes to accurately register respective contacts on the substrate and the flex tail.

While specific embodiments of the invention have been described and illustrated, such embodiments should be considered illustrative of the invention only and not as limiting the invention as construed in accordance with the accompanying claims.

What is claimed is:

1. A method of connecting a first circuit substrate to a second circuit substrate, the method comprising:

mating said first circuit substrate with said second circuit substrate such that a projection of a component mounted on at least one of said first and second circuit substrates is received through an aperture in another of said first and second circuit substrates wherein said aperture, does not include a circuit and is configured to having a shape complementary to said component to allow said projection, to pass there through to register said first and second circuit substrates in a fixed orientation relative to each other in a manner causing at least one contact on one of said first and second circuit substrates to be aligned with and adjacent to at least one corresponding contact said another of said first and second circuit substrates.

2. The method of claim 1 wherein mating further comprises receiving said component in said aperture such that edges of said component contact edges of the other of said first and second circuit substrates defining said aperture.

3. The method of claim 2 wherein receiving said component in said aperture comprising receiving an integrated circuit package in said aperture.

4. The method of claim 1, further comprising clamping said first circuit substrate to said second circuit substrate together to press said at least one contact against at least one corresponding contact.

5. The method claim 4 further comprising clamping said first circuit substrate to said second circuit substrate adjacent to said aperture.

6. The method of in claim 4 wherein clamping further comprising compressing a flexible rubber member against at least one of said first and second circuit substrates.

7. The method of in claim 6 wherein clamping further comprising compressing said flexible rubber member adjacent to said at least one contact and said at least one corresponding contact.

8. The method of claim 7 wherein said first and second circuit substrates have opposing sides and clamping further comprises compressing said flexible rubber member on at least one of said first and second substrates opposite a side on which said at least one contact or said at least one corresponding contact is located.

9. Apparatus for connecting a first circuit substrate to a second circuit substrate, comprising:

means for registering said first and second circuit substrates in a fixed orientation relative to each other, said first circuit substrate having first and second portions, said first portion of said first circuit substrate having an opening and said second portion of said first circuit substrate having at least one contact, said second circuit substrate having first and second portions, said first portion of said second circuit substrate having an opening and said second portion of said second substrate having at least one corresponding contact, said means for registering disposing at least one contact on said first circuit substrate in alignment with and adjacent to said at least one corresponding contact on said second circuit substrate when said first circuit substrate is connected with said second circuit substrate, said means for registering including edges on at least one of said first and second circuit substrates defining said opening through said at least one of said first and second circuit substrates for receiving there through a projection of a component extending from another of said first and second circuit substrates, said opening having a shape complementary to said shape of said projection.

10. The apparatus of claim 9 further comprising means for clamping said first and second circuit substrates together to press at least one contact against at least one corresponding contact.

11. Apparatus for connecting a first circuit on a first circuit substrate to a remotely located circuit where the first circuit substrate has a circuit component of a first shape projecting therefrom, comprising:

a second circuit substrate having a first portion, and a second portion and said second portion having at least one corresponding contact, said second circuit substrate having edges defining an opening in said first portion for receiving said component, said opening having a shape complementary to the shape of said component such that said first and second circuit substrates are registered in a fixed orientation relative to each other with said at least one contact on said first circuit substrate aligned with and adjacent to said at least one corresponding contact on said second circuit substrate.

12. The apparatus of claim 11 wherein said edges are positioned relative to each other to substantially simultaneously contact corresponding edges of said component.

13. The apparatus of claim 11 wherein said first circuit substrate further comprising a rigid circuit substrate and said second circuit substrate includes a flexible circuit substrate.

14. The apparatus of claim 11 further comprising a clamp for clamping said first and second circuit substrates together to press said at least one contact against said at least one corresponding contact.

15. The apparatus of claim 14 wherein said clamp is operable to clamp said first circuit substrate to said second circuit substrate adjacent said opening.

16. The apparatus of claim 14 wherein said clamp further comprising a flexible rubber member and is deformable and operable to compress said flexible rubber member against at least one of said first and second circuit substrates.

17. The apparatus of claim 16 wherein said clamp further comprising first and second jaw portions for receiving said first and second circuit substrates therebetween.

18. A method of connecting a glass circuit substrate to a flexible circuit substrate, the method comprising:

a) mating the glass circuit substrate with the flexible circuit substrate such that a chip on the glass circuit substrate is received in an opening in the flexible circuit substrate, the opening having a shape complementary to the chip, to register the flexible circuit substrate on the glass circuit substrate in a fixed orientation relative thereto in which contacts on the glass circuit substrate are aligned, adjacent and in contact with corresponding contacts on the flexible circuit substrate; and b) clamping the glass and flexible circuit substrates together to press said contacts against said corresponding contacts.

19. Apparatus for connecting a substrate to a circuit board comprising:

a flexible member having first and second portions;

a circuit board having at least one contact coupled to said first portion of said flexible member;

a substrate having at least one contact coupled to said second portion of said flexible member;

said first portion of said flexible member being disposed adjacent to said second portion of said flexible member;

an elongated member coupled between said first and said second portions of said flexible member; and adhesive coupling said first and said second portions to said elongated member.

* * * * *